US012779508B2

(12) United States Patent
Lee et al.

(10) Patent No.: US 12,779,508 B2
(45) Date of Patent: Nov. 3, 2026

(54) SUBSTRATE PROCESSING APPARATUS

(71) Applicant: SEMES CO., LTD., Chungcheongnam-do (KR)

(72) Inventors: Sang Gun Lee, Seoul (KR); Young Joon Han, Chungcheongnam-do (KR); Se Min Kang, Chungcheongnam-do (KR); Ju Ha Woo, Gyeonggi-do (KR); In Ki Jung, Gyeonggi-do (KR); Jeong Hyup Yu, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 549 days.

(21) Appl. No.: 18/475,488

(22) Filed: Sep. 27, 2023

(65) Prior Publication Data

US 2024/0207906 A1 Jun. 27, 2024

(30) Foreign Application Priority Data

Dec. 27, 2022 (KR) ........................ 10-2022-0185516
May 11, 2023 (KR) ........................ 10-2023-0060925

(51) Int. Cl.
*B08B 3/08* (2006.01)
*H10P 72/00* (2026.01)

(52) U.S. Cl.
CPC ............ *B08B 3/08* (2013.01); *H10P 72/0404* (2026.01)

(58) Field of Classification Search
CPC ............................... B08B 3/08; H10P 72/0404
USPC .......................................................... 134/157
See application file for complete search history.

(56) References Cited

U.S. PATENT DOCUMENTS

2009/0038641 A1* 2/2009 Matsumoto ......... H10P 72/0414 156/345.23
2014/0261163 A1 9/2014 Kishita

FOREIGN PATENT DOCUMENTS

KR 10-0785729 B1 12/2007
KR 10-2014-0114296 A 9/2014
KR 10-2021-0000355 A 1/2021

* cited by examiner

*Primary Examiner* — Tinsae B Ayalew
(74) *Attorney, Agent, or Firm* — Carter, DeLuca & Farrell LLP

(57) ABSTRACT

A substrate processing apparatus includes a support unit supporting a substrate, a rear nozzle unit installation unit including a sidewall surrounding the support unit and forming an internal space, a rear nozzle unit including a rear nozzle movably disposed outside of the sidewall to supply liquid toward a rear surface of the substrate and a rear nozzle driving unit connected to the rear nozzle through a partial sidewall portion of the sidewall in the internal space and driving the rear nozzle to move, and a liquid inflow preventing unit disposed on the partial sidewall portion of the sidewall and including an isolation space isolated from the internal space.

20 Claims, 4 Drawing Sheets

SUBSTRATE PROCESSING APPARATUS

CROSS-REFERENCE TO RELATED APPLICATIONS

This application claims benefit of priority to Korean Patent Application Nos. 10-2022-0185516 filed on Dec. 27, 2022 and 10-2023-0060925 filed on May. 11, 2023 in the Korean Intellectual Property Office, the disclosures of which are incorporated herein by reference in their entireties.

BACKGROUND

1. Field

The present disclosure relates to a substrate processing apparatus.

2. Description of Related Art

In order to manufacture semiconductor devices or liquid crystal displays, various processes, such as photolithography, etching, ashing, ion implantation, and thin film deposition are performed on substrates. Before or after such processes are performed, a cleaning process for cleaning substrates is performed to remove contaminants and particles generated in each process.

In general, the cleaning process is a process of supplying a chemical solution to a substrate to remove contaminants and particles attached to the substrate. In particular, in the process of cleaning a rear surface of a substrate, a liquid is supplied to the rear surface of the substrate using a rear nozzle cleaning unit to clean the rear surface of the substrate. The rear nozzle cleaning unit includes a plurality of rear nozzles to supply liquids in various cleaning ranges or to supply various types of liquids to the rear surface of the substrate. For example, a plurality of rear nozzles are disposed at different distances in a radial direction from the center of the substrate to supply liquid to various regions on the rear surface of the substrate. This requires a lot of space for the placement of the rear nozzles. In another related art reference, a rear nozzle unit movable below the substrate is provided to adjust a cleaning range for the rear surface of the substrate. In the case of this structure, in order to perform a normal operation without interfering with other components below the substrate, it is also necessary to appropriately dispose a driving unit of the rear nozzle unit.

RELATED ART DOCUMENT

Patent Document (Patent Document 1) Korea Application Publication No. 10-2021-0000355 A (2021.01.05)

SUMMARY

An aspect of the present disclosure is to provide a substrate processing apparatus capable of adjusting a processing range for a rear surface of a substrate and securing a sealing effect of the apparatus.

According to an aspect of the present disclosure, a substrate processing apparatus includes a support unit supporting a substrate, a rear nozzle unit installation unit including a sidewall surrounding the support unit and forming an internal space, a rear nozzle unit including a rear nozzle movably disposed outside of the sidewall to supply liquid toward a rear surface of the substrate and a rear nozzle driving unit connected to the rear nozzle through a partial sidewall portion of the sidewall in the internal space and driving the rear nozzle to move, and a liquid inflow preventing unit disposed on the partial sidewall portion of the sidewall and including an isolation space isolated from the internal space.

The isolation space may be configured so that a distance according to a moving direction of the rear nozzle is greater than or equal to a moving distance of the rear nozzle.

The liquid inflow preventing unit may include an isolation wall connected to an inner wall surface of the partial sidewall portion and defining the isolation space together with an inner wall surface of the partial sidewall portion, and the rear nozzle driving unit may be connected to the rear nozzle by sequentially passing through the isolation wall, the isolation space, and the partial sidewall portion.

The rear nozzle driving unit may include a connection rod having one end connected to the rear nozzle to pass through the partial sidewall portion, the isolation space and the other end located in the internal space and a rear nozzle driving motor interlocking with the other end of the connection rod and providing driving force for the rear nozzle to move.

The liquid inflow preventing unit may include a sealing member preventing liquid from flowing into the internal space from a gap between the isolation wall and the connection rod.

The sealing member may include a first sealing member coupled to a portion of an outer circumferential surface of the connection rod located on one side of the isolation wall opposite to the isolation space and a sealing wall coupled to one wall surface of the isolation wall, forming a first accommodation space in which the first sealing member is accommodated, and penetrated by the connection rod.

The sealing member may include a second sealing member sealing a contact surface between the isolation wall and the sealing wall, and a second accommodation space surrounding an outer circumference of the first accommodation space and accommodating the second sealing member is formed on a wall surface of at least one of the isolation wall and the sealing wall.

The rear nozzle driving unit may further include an interlocking rod connecting the other end of the connection rod and an output shaft of the rear nozzle driving motor.

A drainage hole communicating with the isolation space may be formed in the partial sidewall portion of the sidewall.

The isolation space may be provided as at least one isolation space arranged to be spaced apart from each other in a moving direction of the rear nozzle.

The rear nozzle unit may be provided as a plurality of rear nozzle units.

Rear nozzles of the plurality of rear nozzle units may be arranged to be symmetrical to each other with respect to a center of the support unit.

The rear nozzle may be configured to be movable in a certain range of movement in a radial direction passing through a center of a support chuck of the support unit.

The certain range of movement may be 3 mm to 30 mm.

The rear nozzle unit installation unit may include a guide wall extending downwardly from an upper end of the sidewall in a radial direction outwardly and exposing the rear nozzle.

According to another aspect of the present disclosure, a substrate processing apparatus includes a support unit supporting a substrate, a rear nozzle unit installation unit including a sidewall surrounding the support unit and forming an internal space, a rear nozzle unit disposed in the rear nozzle installation unit, and a liquid inflow preventing unit, wherein the rear nozzle unit includes a rear nozzle movably disposed outside of the sidewall to supply liquid toward a rear surface of the substrate, and a rear nozzle driving unit including a connection rod connected to the rear nozzle through a partial sidewall portion of the sidewall in the internal space and driving the rear nozzle to move, and the liquid inflow preventing unit includes an isolation wall connected to the partial sidewall portion of the sidewall, having an isolation space isolated from the internal space, and penetrated by the connection rod, and a sealing member preventing liquid from flowing into the internal space from a gap between the isolation wall and the rear nozzle driving unit.

The sealing member may include a first sealing member coupled to a portion of an outer circumferential surface of the connection rod located on one side of the isolation wall opposite to the isolation space, a sealing wall coupled to one wall surface of the isolation wall and penetrated by the connection rod, and a second sealing member sealing a contact surface between the isolation wall and the sealing wall, wherein the sealing wall may have a first accommodation space in which the first sealing member is accommodated and a second accommodation space in which the second sealing member is accommodated, the second accommodation space surrounding an outer circumference of the first accommodation space at one wall surface opposite to the isolation wall, and the connection rod may have one end connected to the rear nozzle and passing through the partial sidewall portion, the isolation space, the isolation wall, and the sealing wall, and the other end located in the internal space.

The isolation space may be configured so that a distance according to a moving direction of the rear nozzle is greater than or equal to a moving distance of the rear nozzle, and a drainage hole communicating with the isolation space may be formed in the partial sidewall portion of the sidewall.

The rear nozzle driving unit may include a rear nozzle driving motor interlocked with the other end of the connection rod located in the internal space to provide driving force for the rear nozzle to move and an interlocking rod connecting the other end of the connection rod and an output shaft of the rear nozzle driving motor.

According to another aspect of the present disclosure, a substrate processing apparatus includes a process chamber, a processing container disposed within the process chamber and having a processing space therein, a support unit disposed in the processing container and including a support chuck supporting a substrate, a rotating shaft connected to a lower portion of the support chuck, and a support chuck driving unit connected to the rotating shaft and driving the support chuck to rotate about the rotating shaft, a rear nozzle unit installation unit including a sidewall surrounding the support chuck and the rotating shaft and forming an internal space and a guide wall extending downwardly from an upper end of the sidewall in a radial direction outwardly, a supply unit including a first rear nozzle unit and a second rear nozzle unit disposed in the rear nozzle unit installation unit, and a liquid inflow preventing unit, wherein each of the first rear nozzle unit and the second rear nozzle unit includes a rear nozzle exposed to an upper portion of the guide wall and disposed to be movable in a radial direction of the support unit passing through a center of the support chuck from outside of the sidewall to supply liquid toward a rear surface of the substrate, and a rear nozzle driving unit including a connection rod connected to the rear nozzle through a partial sidewall portion of the sidewall in the internal space and driving the rear nozzle to move, wherein the rear nozzle of the first rear nozzle unit and the rear nozzle of the second rear nozzle unit are disposed opposite to each other with respect to the rotating shaft on an outer side of the sidewall, and the liquid inflow preventing unit includes an isolation wall connected to the partial sidewall portion of the sidewall, forming an isolation space isolated from the internal space, and penetrated by the connection rod and a sealing member preventing liquid from flowing into the internal space from a gap between the isolation wall and the rear nozzle driving unit.

The rear nozzle driving unit may include a rear nozzle driving motor interlocked with the other end of the connection rod located in the internal space to provide driving force for the rear nozzle to move, and an interlocking rod connecting the other end of the connection rod and an output shaft of the rear nozzle driving motor, wherein the rear nozzle driving motor and the interlocking rod may be located outside the support chuck driving unit in the internal space.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
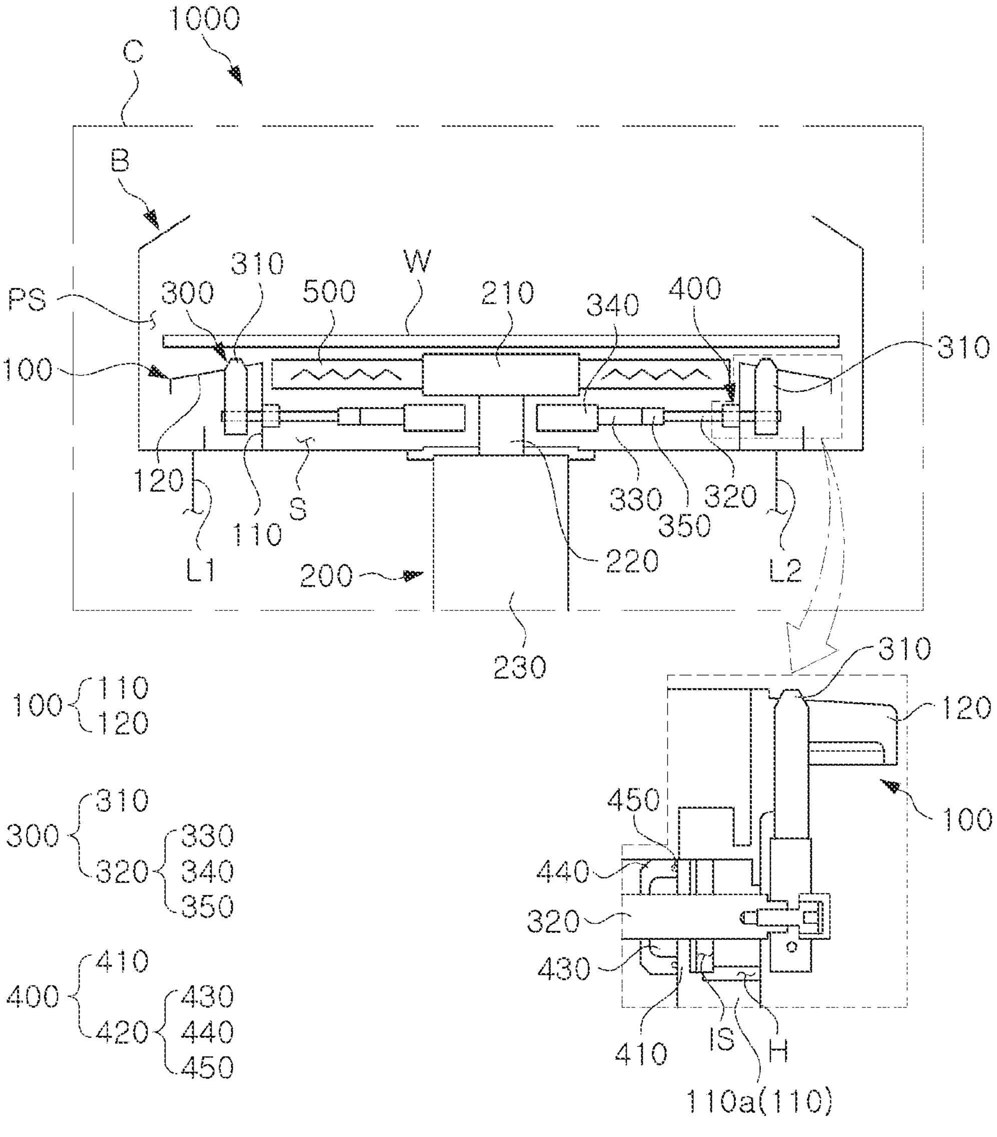
FIG. 1 is an exemplary view illustrating a configuration of a substrate processing apparatus according to an exemplary embodiment in the present disclosure.

Hereinafter, exemplary embodiments of the present disclosure will be described in detail with reference to the accompanying drawings so that those of ordinary skill in the art may easily implement the exemplary embodiments. The exemplary embodiments may, however, be embodied in many different forms and is not limited to the exemplary embodiments set forth herein.

In the drawings, parts irrelevant to the description are omitted to clearly describe the present disclosure, and like reference numerals denote like elements throughout the specification.

In addition, in various exemplary embodiments, components having the same configuration will be described only in representative exemplary embodiments using the same reference numerals, and in other exemplary embodiments, only configurations different from the representative exemplary embodiments will be described.

Throughout the specification, when a portion is referred to as being "connected" to another part, it may not only be "directly connected" to the other portion but also may be "electrically connected" to the other portion via an intervening element. When a certain portion is referred to as "including" a certain component, this does not exclude other components unless described otherwise, and other components may be further included.

Unless otherwise defined, the meaning of all terms including technical and scientific terms used herein is the same as that commonly understood by one of ordinary skill in the art to which the present disclosure belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Hereinafter, a substrate processing apparatus according to an exemplary embodiment in the present disclosure will be described with reference to the drawings.

Figure 2:
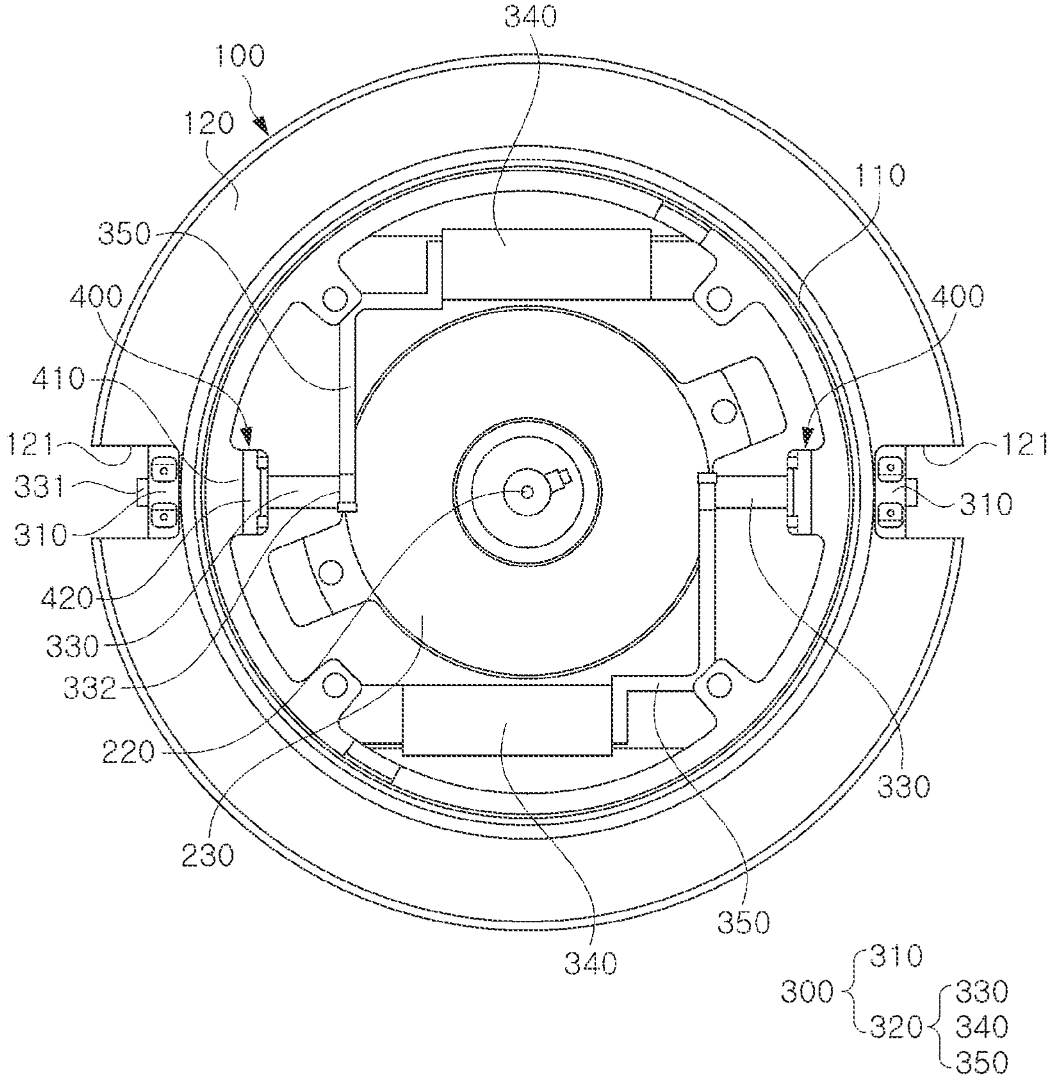
FIG. 2 is a view illustrating some components of a substrate processing apparatus according to an exemplary embodiment in the present disclosure.
Figure 3:
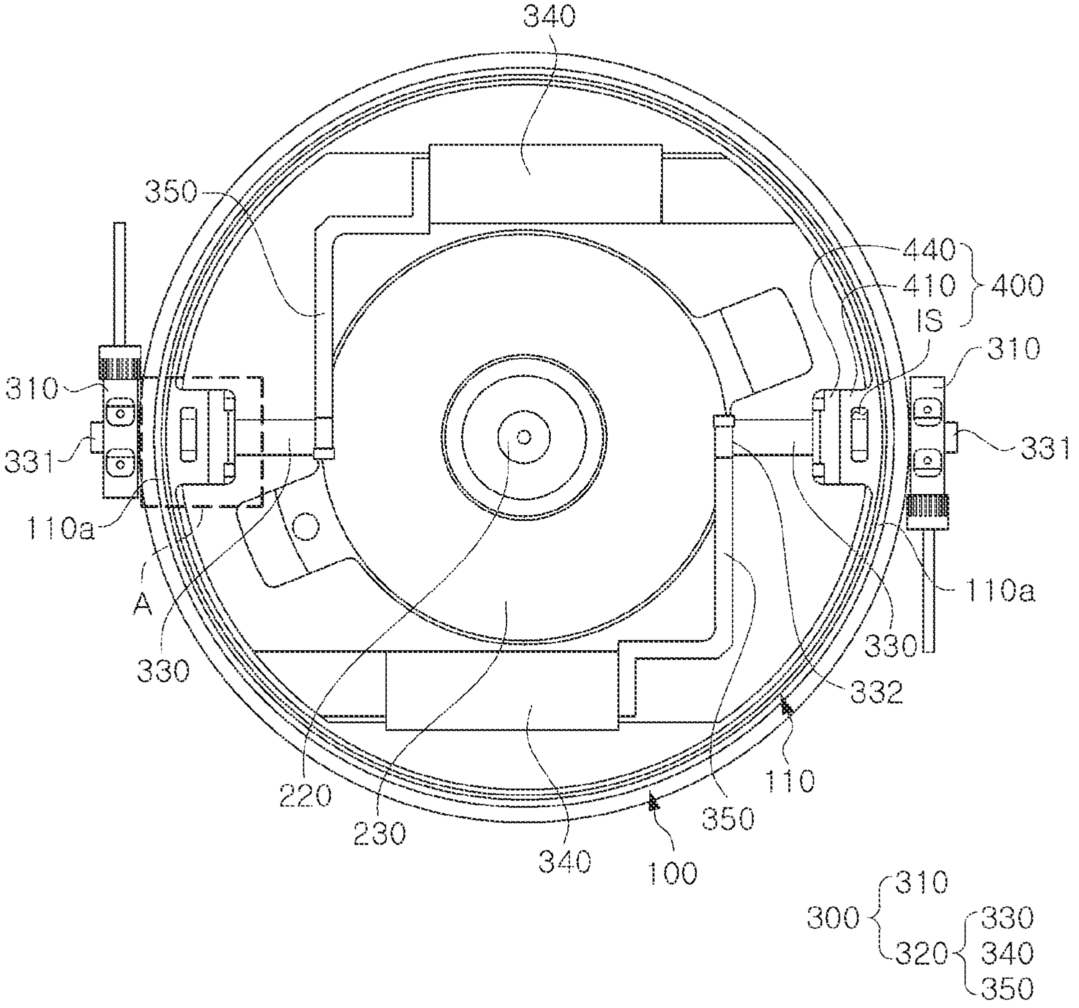
FIG. 3 is a plan view illustrating a configuration of a substrate processing apparatus according to an exemplary embodiment in the present disclosure.
Figure 4:
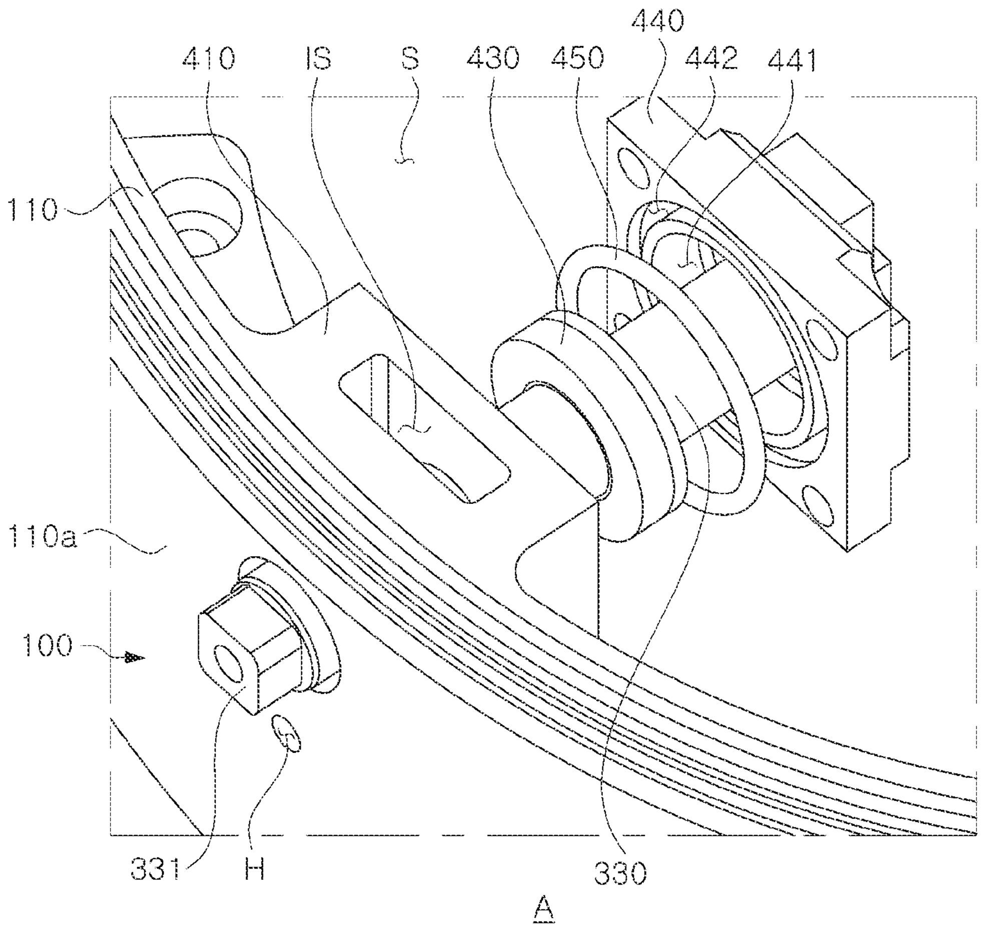
FIG. 4 is an exploded view illustrating structures of a nozzle driving unit and a sealing member of a substrate processing apparatus according to an exemplary embodiment in the present disclosure.

FIG. 1 is an exemplary view illustrating a configuration of a substrate processing apparatus according to an exemplary embodiment in the present disclosure, FIG. 2 is a view illustrating some components of a substrate processing apparatus according to an exemplary embodiment in the present disclosure, FIG. 3 is a plan view illustrating a configuration of a substrate processing apparatus according to an exemplary embodiment in the present disclosure, and FIG. 4 is an exploded view illustrating structures of a nozzle driving unit and a sealing member of a substrate processing apparatus according to an exemplary embodiment in the present disclosure.

Referring to FIGS. 1 to 4, a substrate processing apparatus 1000 according to an exemplary embodiment in the present disclosure includes a process chamber C for performing a processing process on a substrate W with a processing liquid, such as a chemical liquid. In such a process chamber C, a processing process is performed on the substrate W while the substrate W is rotated and maintained horizontally. The processing process may be a cleaning process of cleaning contaminants on the substrate W or an etching process of etching a film formed on the substrate W. However, the processing process performed in the process chamber C in the present disclosure is not limited thereto, and various processes, in addition to the cleaning process and etching process, may be applied if a liquid is supplied to a rear surface of the substrate W to perform the processing process on the rear surface of the substrate.

The substrate processing apparatus 1000 according to an exemplary embodiment in the present disclosure includes a processing container B, a support unit 200, a rear nozzle unit installation unit 100, a supply unit, and liquid inflow preventing unit 400 disposed in a process chamber C.

The processing container B, disposed to surround the substrate W and recovering the liquid supplied to the substrate W, may be disposed in the process chamber C and may have a process space PS for processing the substrate W therein. Specifically, the processing container B may have a cylindrical shape or a polygonal shape with an open upper portion and may have a processing space PS for processing the substrate W therein. The open upper surface of the processing container B serves as a path for loading and unloading the substrate W. In the process of processing the substrate W, a drain line L1 for discharging a liquid and an exhaust line L2 for discharging gas may be connected to the processing container B. The processing container B may be disposed to be movable in a vertical direction by an elevating unit. Therefore, as the processing container B moves upwardly or downwardly in the vertical direction, a relative height of the processing container B may change with respect to a support chuck 210 of the support unit 200 to be described below. When the substrate W is loaded onto or unloaded from the support chuck 210 of the support unit 200 to be described below, the support chuck 210 of the support unit 200 may lower the processing container B in a vertical direction so that the support chuck 210 may protrude upwardly from the processing container B.

The support unit 200 is configured to support the substrate W, and is disposed in the processing container B to support the substrate W. Specifically, the support unit 200 may include the support chuck 210, a rotating shaft 220 and a support chuck driving unit 230. The support chuck 210 may rotate the substrate W about the rotating shaft 220 by the support chuck driving unit 230 in a state in which the substrate W is supported on an upper surface thereof. The rotating shaft 220 may be connected to a lower portion of the support chuck 210 and disposed. The support chuck driving unit 230 may be connected to the rotating shaft 220 and may drive the support chuck 210 to rotate about the rotating shaft 220, and may be configured as, for example, a driving motor. Accordingly, the support chuck 210 may be rotated together with the substrate W about the rotating shaft 220 by driving the support chuck driving unit 230 in a state in which the substrate W is fixed on an upper surface of the support chuck 210.

In addition, the substrate processing apparatus 1000 may further include a temperature control plate 500 controlling temperature of the substrate W. A heating unit, such as a heater, may be disposed in the temperature control plate 500, and a gas supply line may be disposed therein and gas flowing into the supply line may be heated by the heating unit and supplied to the rear surface of the substrate W. The temperature control plate 500 may be disposed around an outer circumference of the support chuck 110 of the support unit 100, and in this case, a sidewall 110 of a rear nozzle unit installation unit 100 may be disposed to surround the outer circumference of the temperature control plate 500.

The rear nozzle unit installation unit 100 may include a sidewall 110. The sidewall 110 of the rear nozzle unit installation unit 100 surrounds the support unit 200 and forms an internal space S. In detail, the sidewall 110 of the rear nozzle unit installation unit 100 may be disposed to surround the support chuck 210 and the rotating shaft 220 of the support unit 200. A rear nozzle unit 300 of a supply unit to be described below may be disposed in the rear nozzle unit installation unit 100. In addition, the rear nozzle unit installation unit 100 may additionally include a guide wall 120. The guide wall 120 of the rear nozzle unit installation unit 100 may extend downwardly from an upper end of the sidewall 110 outwardly in a radial direction and may be disposed below an edge of the substrate W. The guide wall 120 may extend downwardly from the upper end of the sidewall 110 outwardly in the radial direction and extend curvedly. The rear nozzle unit installation unit 100 may be formed in various forms. For example, the rear nozzle unit installation unit 100 may be included in the processing container B as a partial component of the processing container B. Specifically, when the processing container B includes an outer cup and an inner cup disposed to surround the support chuck 210 and the rotating shaft 220 of the support unit 200, the rear nozzle unit installation unit 100 may be configured as the inner cup of the processing container B to guide gas or liquid to flow to the exhaust line and the drain line in the process of processing the substrate W. However, the present disclosure is not limited thereto, and if necessary, the rear nozzle unit installation unit 100 may be included in the support unit 200 as a portion of the support unit 200. In other words, of course, the rear nozzle unit installation unit 100 may be formed of a structure, such as a support body surrounding the support chuck and the rotating shaft of the support unit 200, if necessary. Also, as another example, the rear nozzle unit installation unit 100 may be configured as a separate component, different from the processing container and the support unit. The supply unit supplies liquid to the substrate W supported by the support unit 200, and specifically, the substrate W supported by the support unit 200 may supply various liquids to the substrate through the supply unit in a rotating state to process the substrate W. Specifically, the supply unit may include a front nozzle unit (not shown) for supplying liquid toward a front surface (upper surface) of the substrate W and a rear nozzle unit 300 for supplying liquid toward the rear surface (lower surface) of the substrate W. The supply unit includes a liquid supply line connected to a liquid source for supplying liquid, and supplies liquid for cleaning or etching the substrate W to the front nozzle unit and the rear nozzle unit 300 through the liquid supply line to process the front surface and the rear surface of the substrate W. The liquid source may be a liquid source for storing liquid, such as a bottle or a tank for supplying liquid. Here, the front nozzle unit and the rear nozzle unit 300 may be connected to one liquid supply line or to different liquid supply lines. Various components, such as a pump, a filter, a heater, a tank, and a control valve, may be disposed in the liquid supply line as needed.

In addition, in the present disclosure, the front nozzle unit may be a nozzle unit commonly used to process the front surface of the substrate during a substrate processing process, and a description thereof will be omitted, and the rear nozzle unit 300 will be described in detail below.

The rear nozzle unit 300 may include a rear nozzle 310 and a rear nozzle driving unit 320.

The rear nozzle 310 is movably disposed outside of the sidewall 110 of the rear nozzle unit installation unit 100 to supply liquid toward the rear surface of the substrate W. The rear nozzle 310 may supply liquid toward the edge of the rear surface of the substrate W. Specifically, the rear nozzle 310 may be disposed to be movable by a rear nozzle driving unit 320 in a radial direction of the support unit 200 passing through the center of the support chuck 210 from the outside of the sidewall 110 of the rear nozzle unit installation unit 100. The rear nozzle 310 may pass through a guide wall 120 of the rear nozzle unit installation unit 100 to supply liquid to the rear surface of the substrate. In this case, a recess 121 exposing the rear nozzle 310 may be formed in the guide wall 120. The rear nozzle 310 may be configured to move in a movement range of 3 mm to 30 mm in the radial direction of the support unit 200 passing through the center of the support chuck 210 from the outside of the sidewall 110 of the rear nozzle unit installation unit 100. However, the present disclosure is not limited thereto and may be implemented to be movable within various movement ranges actually as necessary. The rear nozzle driving unit 320 may be connected to the rear nozzle 310 through a partial sidewall portion **110*a* of the sidewall 110 of the rear nozzle unit installation unit 100 in the internal space S of the sidewall 110 of the rear nozzle unit installation unit 100 and may drive the rear nozzle 310 to move. Since the rear nozzle driving unit 320 is disposed in the internal space S of the sidewall 110 of the rear nozzle unit installation unit 100 and is separated from the outside of the sidewall 110 of the rear nozzle unit installation unit 100 that liquid directly contacts, it is possible to prevent the occurrence of corrosion in a portion of the rear nozzle driving unit 320 formed of a material, such as a metal material vulnerable to liquid due to contact with liquid. The rear nozzle driving unit 320 may be configured in various exemplary embodiments as long as it is configured to movably drive the rear nozzle 310 from the outside of the sidewall 110 of the rear nozzle unit installation unit 100**, and a description thereof will be given below.

The liquid inflow preventing unit 400 is configured to prevent liquid supplied to the rear surface of the substrate W through the rear nozzle 310 from flowing from the outside of the sidewall 110 of the rear nozzle unit installation unit 100 to the internal space S of the sidewall 110 of the rear nozzle unit installation unit 100, may be disposed in the partial sidewall portion **110*a* of the sidewall 110 of the rear nozzle unit installation unit 100 penetrated by the rear nozzle driving unit 320, and may include isolation space IS isolated from the internal space S of the sidewall 110 of the rear nozzle unit installation unit 100**.

Here, the isolation space IS may be formed of at least one spaced apart from each other in a moving direction of the rear nozzle 310. For example, in FIGS. 1 to 4, a structure in which one isolation space IS is disposed in the partial sidewall portion **110*a* of the sidewall 110 of the rear nozzle unit installation unit 100 through which the rear nozzle driving unit 320** penetrates. However, the present disclosure is not limited thereto and a structure in which a plurality of isolation spaces are arranged may also be implemented.

According to this configuration, the rear nozzle 310 may be moved outside the sidewall 110 of the rear nozzle unit installation unit 100 according to driving of the rear nozzle driving unit 320 of the rear nozzle unit 300, so that a discharge position of the rear nozzle 310 may be adjusted, and accordingly, a processing range for the rear surface of the substrate W may be adjusted. In addition, by applying a structure isolated from the internal space S of the sidewall 110 of the rear nozzle installation unit 100 through the isolation space IS of the liquid inflow preventing unit 400 disposed in the partial sidewall portion **110*a* of the sidewall 110 of the rear nozzle unit installation unit 100 that the rear nozzle driving unit 320 penetrates, liquid may be effectively prevented from flowing into the internal space S from the outside of the sidewall 110 of the rear nozzle installation unit 100 during a process of processing the substrate W by supplying liquid toward the rear surface of the substrate W supported in a rotating state on the upper surface of the support chuck 210 of the support unit 200, thereby securing a sealing effect of the substrate processing apparatus 1000**.

The liquid inflow preventing unit 400 may include an isolation wall 410. The isolation wall 410 may be connected to an inner wall surface of the partial sidewall portion **110*a* of the sidewall 110 of the rear nozzle unit installation unit 100. In this case, the isolation space IS may be defined together with the isolation wall 410 and the inner wall surface of the partial sidewall portion 110*a*. In the isolation space IS, a distance according to the moving direction of the rear nozzle 310 may be greater than or equal to the moving distance of the rear nozzle 310. Accordingly, since the isolation space IS is isolated by at least a reciprocating distance of the rear nozzle 310, direct inflow of liquid into the internal space S of the sidewall 110 of the rear nozzle unit installation unit 100 due to the movement of the rear nozzle 310** may be effectively prevented.

In addition, a drainage hole H communicating with the isolation space IS may be formed in the partial sidewall portion **110*a* of the sidewall 110 of the rear nozzle unit installation unit 100. This drainage hole H may be connected to a bottom surface of the isolation space IS, and accordingly, liquid that may flow into the isolation space IS may be easily discharged to the outside of the sidewall 110 of the rear nozzle unit installation unit 100. The drainage hole H may be inclined downwardly from the bottom surface of the isolation space IS toward the partial sidewall portion 110***a*. The inclined structure may allow the liquid in the isolation space IS to be more easily and quickly discharged to the outside of the sidewall 110 of the rear nozzle unit installation unit 100, and at the same time, may effectively prevent inflow from the outside of the sidewall 110 of the installation unit 100 to the isolation space IS in a reverse direction.

Here, the rear nozzle driving unit 320 may be connected to the rear nozzle 310 sequentially through the isolation wall 410 of the liquid inflow preventing unit 400, the isolation space IS, and the partial sidewall portion 110*a* of the sidewall 110 of the rear nozzle unit installation unit 100. In other words, the rear nozzle driving unit 320 may sequentially pass through the isolation wall 410, the isolation space IS, and the partial sidewall portion 110*a* of the sidewall 110 of the rear nozzle unit installation unit 100 to be connected to the rear nozzle 310.

As a specific example, the rear nozzle driving unit 320 may include a connection rod 330 and a rear nozzle driving motor 340. The connection rod 330 may have one end 331 connected to the rear nozzle 310 and pass through the partial sidewall portion 110*a* of the sidewall 110 of the rear nozzle unit installation unit 100, the isolation space IS, the isolation wall 410, and the other end 332 of the connection rod 330 may be located in the internal space S of the sidewall 110 of the rear nozzle unit installation unit 100. The rear nozzle driving motor 340 may be interlocked with the other end 332 of the connection rod 330 to provide a driving force to move the rear nozzle 310.

Here, an output shaft of the rear nozzle driving motor 340 may be directly or indirectly connected to the other end 332 of the connection rod 330 according to actual needs.

For example, the output shaft of the rear nozzle driving motor 340 may be indirectly connected to the other end 332 of the connection rod 330 through a power transmission unit so that the rear nozzle driving motor 340 implements an appropriate arrangement structure in the limited internal space S of the sidewall 110 of the rear nozzle unit installation unit 100. In this case, specifically, as an example of the power transmission unit, the rear nozzle driving unit 320 may further include an interlocking rod 350 connecting the other end 332 of the connection rod 330 and the output shaft of the rear nozzle driving motor 340. The interlocking rod 350 may be implemented in various forms depending on an arrangement position of the rear nozzle driving motor 340 and the rear nozzle 310. In a structure in which the support chuck driving unit 230 is disposed in the center of the internal space S of the sidewall 110 of the rear nozzle unit installation unit 100, the rear nozzle driving motor 340 may be disposed to be adjacent to the edge in the internal space S of the sidewall 110 of the rear nozzle unit installation unit 100 and may be disposed outside the chuck driving unit 230. For example, as illustrated in FIG. 3, the interlocking rod 350 may be formed in an L-shape and may have a plurality of curved shapes, so that an arrangement position of the rear nozzle 310 and the rear nozzle driving motor 340 may be appropriately implemented, and the rear nozzle driving motor 340 may be located in an empty space without interference with the support chuck driving unit 230 in the internal space S of the sidewall 110 of the rear nozzle unit installation unit 100.

Furthermore, as illustrated in FIGS. 3 and 4, the liquid inflow preventing unit 400 may include a sealing member 420. The sealing member 420 may effectively prevent the possibility that liquid flows into the internal space S of the sidewall 110 of the rear nozzle unit installation unit 100 from a gap between the isolation wall 410 and the connection rod 330 of the rear nozzle driving unit 320.

The sealing member 420 may include a first sealing member 430 and a sealing wall 440. The first sealing member 430 may be coupled to a portion of an outer circumferential surface of the connection rod 330. Specifically, the first sealing member 430 may be coupled to the portion of the outer circumferential surface of the connection rod 330 located on one side of the isolation wall 410 opposite to the isolation space IS. The first sealing member 430 may have a ring shape, and a sealing wall 440 may be provided to accommodate the first sealing member 430. The sealing wall 440 may be coupled to one sidewall of the isolation wall 410 opposite to the isolation space IS. A first accommodation space 441 in which the first sealing member 430 is accommodated may be formed in the sealing wall 440 and the connection rod 330 may pass therethrough. In other words, the sealing wall 440 may be coupled to one sidewall of the isolation wall 410 using a fastening member. In this case, one end 331 of the connection rod 330 located outside the isolation wall 410 is connected to the other end of the rear nozzle 310 through the isolation wall 410 and the sealing wall 440, and the other end 332 of the connection rod 330 may be connected to the interlocking rod 350. At this time, the first sealing member 430 coupled to a portion of the outer circumferential surface of the connection rod 330 is accommodated in the first accommodation space 441 of the sealing wall 440 facing the isolation wall 410, so that inflow of liquid into the internal space S of the sidewall 110 of the rear nozzle unit installation unit 100 by the circumferential surface of the connection rod may be effectively prevented by the movement of the connection rod 330. That is, by disposing the first sealing member 430 and the sealing wall 440, inflow of liquid in the moving direction of the rear nozzle 310 may be effectively prevented during the process of driving the movement of the rear nozzle 310 by the rear nozzle driving unit 320.

In addition, in order to prevent leakage of liquid through a contact surface between the isolation wall 410 and the sealing wall 440, the sealing member 420 may further include a second sealing member 450 sealing the contact surface between the isolation wall 410 and the sealing wall 440. The second sealing member 450 may be formed in an O-ring shape, but is not limited thereto and may be configured in various shapes, of course. In order to accommodate the second sealing member 450, a second accommodation space 442 may be formed on a wall surface of at least one the isolation wall 410 and the sealing wall 440 facing each other. The second accommodation space 442 may be disposed to surround the outer circumference of the first accommodation space 441. For example, the second accommodation space 442 may be formed in the sealing wall 440, and the first sealing member 430 and the second sealing member 450 may be accommodated through the first accommodation space 441 and the second accommodation space 442 of the sealing wall 440 and then the sealing wall 440 may be coupled to the isolation wall 410.

Meanwhile, the rear nozzle unit 300 may be provided as a single rear nozzle unit or a plurality of rear nozzle units. For example, in order to improve the processing efficiency with respect to the rear surface of the substrate W, as illustrated in FIG. 3, two rear nozzle units 300 are illustrated, but the present inventive concept is not limited thereto, and one or two or more rear nozzle units may be provided to supply various liquids. In addition, the rear nozzle unit 300 may be configured to be able to adjust a spray angle according to a processing position of the substrate W, if necessary.

Furthermore, when there are a plurality of rear nozzle units 300, the rear nozzles 310 of the plurality of rear nozzle units 300 may be disposed to be symmetrical with each other based on the center of the support unit 200 to ensure uniformity of processing on the rear surface of the substrate W.

For example, when two rear nozzle units 300 including a first rear nozzle unit 300*a* and a second rear nozzle unit 300*b* are configured, the first rear nozzle unit 300*a* and the second rear nozzle unit 300*b* may include the same components and have different arrangement positions for the support unit 200. That is, each of the first rear nozzle unit 300*a* and the second rear nozzle unit 300*b* may include the rear nozzle 310 and the rear nozzle driving unit 320. Specifically, the rear nozzle 310 of each of the first rear nozzle unit 300*a* and the second rear nozzle unit 300*b* may be disposed to be movable in the radial direction of the support unit 200 passing through the center of the support chuck 210 from the outside of the sidewall 110 of the rear nozzle unit installation unit 100 to supply liquid toward the rear surface of the substrate W. The rear nozzle 310 of the first rear nozzle unit 300*a* and the rear nozzle 310 of the second rear nozzle unit 300*b* including such a configuration may be exposed upwardly from the guide wall 120 of the rear nozzle unit installation unit 100 and may be disposed in positions facing each other based on the rotating shaft 220 outside the sidewall 110 of the rear nozzle unit installation unit 100. The rear nozzle driving unit 320 of each of the first rear nozzle unit 300*a* and the second rear nozzle unit 300*b* may include the connection rod 330 having one end 331 connected to the rear nozzle 310, the interlocking rod 350 having one end connected to the other end 332 of the connection rod 330, and the rear nozzle driving motor 340 having an output shaft connected to the other end of the interlocking rod 350. That is, since the interworking rod 350 has a structure of connecting the other end 332 of the connection rod 330 and the output shaft of the rear nozzle driving motor 340, the rear nozzle driving motor 340 may be disposed in an appropriate position without interfering with other components in the internal space S of the sidewall 110 of the rear nozzle unit installation unit 100 depending on the shape of the interlocking rod 350. For example, the rear nozzle driving motors 340 and the interlocking rod 350 of the first rear nozzle unit 300*a* and the second rear nozzle unit 300*b* may be located outside the support chuck driving unit 230 in the internal space S of the sidewall 110 of the rear nozzle unit installation unit 100. The arrangement position of the rear nozzle driving unit 320 of each of the first rear nozzle unit 300*a* and the second rear nozzle unit 300*b* is not particularly limited, and the rear nozzle driving unit 320 may be appropriately disposed in the internal space S of the sidewall 110 of the rear nozzle unit installation unit 100.

According to this configuration, the rear nozzle 310 may be moved outside the sidewall 110 of the rear nozzle unit installation unit 100 according to driving of the rear nozzle driving unit 320 of the rear nozzle unit 300, so that a discharge position of the rear nozzle 310 may be adjusted, and accordingly, the processing range for the rear surface of the substrate W may be adjusted. In addition, by applying the structure isolated from the internal space S of the support unit 200 through the isolation space IS of the liquid inflow preventing unit 400 disposed in the partial sidewall portion 110*a* of the sidewall 110 of the rear nozzle unit installation unit 100 through which the rear nozzle driving unit 320 passes, inflow of liquid into the internal space S of the support unit 200 from the outside of the sidewall 110 of the rear nozzle unit installation unit 100 may be effectively prevented during a process of processing the substrate W by supplying liquid toward the rear surface of the substrate W supported in a rotational state on the upper surface of the support chuck 210 of the support unit 200 using the rear nozzle unit 300, thereby securing a sealing effect of the substrate processing apparatus 1000.

According to the substrate processing apparatus having the above configuration, the rear nozzle may be moved from the outside of the sidewall of the rear nozzle unit installation unit according to driving of the rear nozzle driving unit of the rear nozzle unit, so that a discharge position of the rear nozzle may be adjusted and the processing range with respect to the rear surface of the substrate may be adjusted. In addition, by applying the structure isolated from the internal space of the support unit through the isolation space of the liquid inflow preventing unit disposed in the partial sidewall portion of the sidewall of the rear nozzle unit installation unit through which the rear nozzle driving unit passes, inflow of liquid into the internal space of the support unit from the outside of the sidewall of the rear nozzle unit installation unit may be effectively prevented during a process of processing the substrate by supplying liquid toward the rear surface of the substrate supported in a rotational state on the upper surface of the support chuck of the support unit using the rear nozzle unit, thereby securing a sealing effect of the substrate processing apparatus.

While example exemplary embodiments have been illustrated and described above, it will be apparent to those skilled in the art that modifications and variations could be made without departing from the scope of the present disclosure as defined by the appended claims.

What is claimed is:

1. A substrate processing apparatus comprising:

a support unit supporting a substrate;

a rear nozzle unit installation unit including a sidewall surrounding the support unit and forming an internal space;

a rear nozzle unit including a rear nozzle movably disposed outside of the sidewall to supply liquid toward a rear surface of the substrate and a rear nozzle driving unit connected to the rear nozzle through a partial sidewall portion of the sidewall in the internal space and driving the rear nozzle to move; and a liquid inflow preventing unit disposed on the partial sidewall portion of the sidewall and including an isolation space isolated from the internal space.

2. The substrate processing apparatus according to claim 1, wherein the isolation space extends in a moving direction of the rear nozzle by a length that is greater than or equal to a moving distance of the rear nozzle.

3. The substrate processing apparatus according to claim 1, wherein the liquid inflow preventing unit includes an isolation wall connected to an inner wall surface of the partial sidewall portion and defining the isolation space together with the inner wall surface of the partial sidewall portion, and the rear nozzle driving unit is connected to the rear nozzle by sequentially passing through the isolation wall, the isolation space, and the partial sidewall portion.

4. The substrate processing apparatus according to claim 3, wherein the rear nozzle driving unit includes a connection rod having one end connected to the rear nozzle to pass through the partial sidewall portion, the isolation space and the other end located in the internal space and a rear nozzle driving motor interlocking with the other end of the connection rod and providing driving force for the rear nozzle to move.

5. The substrate processing apparatus according to claim 4, wherein the liquid inflow preventing unit includes a sealing member preventing liquid from flowing into the internal space from a gap between the isolation wall and the connection rod.

6. The substrate processing apparatus according to claim 5, wherein the sealing member includes:

a first sealing member coupled to a portion of an outer circumferential surface of the connection rod located on one side of the isolation wall opposite to the isolation space; and a sealing wall coupled to one wall surface of the isolation wall, forming a first accommodation space in which the first sealing member is accommodated, and penetrated by the connection rod.

7. The substrate processing apparatus according to claim 6, wherein the sealing member includes a second sealing member sealing a contact surface between the isolation wall and the sealing wall, and a second accommodation space surrounding an outer circumference of the first accommodation space and accommodating the second sealing member is formed on a wall surface of at least one of the isolation wall and the sealing wall.

8. The substrate processing apparatus according to claim 4, wherein the rear nozzle driving unit further includes an interlocking rod connecting the other end of the connection rod and an output shaft of the rear nozzle driving motor.

9. The substrate processing apparatus according to claim 1, wherein a drainage hole communicating with the isolation space is formed in the partial sidewall portion of the sidewall.

10. The substrate processing apparatus according to claim 1, wherein the isolation space is provided as at least two isolation spaces arranged to be spaced apart from each other in a moving direction of the rear nozzle.

11. The substrate processing apparatus according to claim 1, wherein the rear nozzle unit is provided as a plurality of rear nozzle units.

12. The substrate processing apparatus according to claim 11, wherein rear nozzles of the plurality of rear nozzle units are arranged to be symmetrical to each other with respect to a center of the support unit.

13. The substrate processing apparatus according to claim 1, wherein the rear nozzle is configured to be movable in a certain range of movement in a radial direction passing through a center of a support chuck of the support unit.

14. The substrate processing apparatus according to claim 1, wherein the rear nozzle unit installation unit includes a guide wall extending downwardly from an upper end of the sidewall in a radial direction outwardly and exposing the rear nozzle.

15. A substrate processing apparatus including a support unit supporting a substrate, a rear nozzle unit installation unit including a sidewall surrounding the support unit and forming an internal space, a rear nozzle unit disposed in the rear nozzle installation unit, and a liquid inflow preventing unit, wherein the rear nozzle unit includes a rear nozzle movably disposed outside of the sidewall to supply liquid toward a rear surface of the substrate; and a rear nozzle driving unit including a connection rod connected to the rear nozzle through a partial sidewall portion of the sidewall in the internal space and driving the rear nozzle to move, and the liquid inflow preventing unit includes an isolation wall connected to the partial sidewall portion of the sidewall, having an isolation space isolated from the internal space, and penetrated by the connection rod; and a sealing member preventing liquid from flowing into the internal space from a gap between the isolation wall and the rear nozzle driving unit.

16. The substrate processing apparatus according to claim 15, wherein the sealing member includes:

a first sealing member coupled to a portion of an outer circumferential surface of the connection rod located on one side of the isolation wall opposite to the isolation space;

a sealing wall coupled to one wall surface of the isolation wall and penetrated by the connection rod; and a second sealing member sealing a contact surface between the isolation wall and the sealing wall, wherein the sealing wall has a first accommodation space in which the first sealing member is accommodated and a second accommodation space in which the second sealing member is accommodated, the second accommodation space surrounding an outer circumference of the first accommodation space at one wall surface opposite to the isolation wall, and the connection rod has one end connected to the rear nozzle and passing through the partial sidewall portion, the isolation space, the isolation wall, and the sealing wall, and the other end located in the internal space.

17. The substrate processing apparatus according to claim 16, wherein the isolation space extends in a moving direction of the rear nozzle by a length that is greater than or equal to a moving distance of the rear nozzle, and a drainage hole communicating with the isolation space is formed in the partial sidewall portion of the sidewall.

18. The substrate processing apparatus according to claim 15, wherein the connection rod has one end connected to the rear nozzle, and the rear nozzle driving unit includes:

a rear nozzle driving motor interlocked with the other end of the connection rod located in the internal space to provide driving force for the rear nozzle to move; and an interlocking rod connecting the other end of the connection rod and an output shaft of the rear nozzle driving motor.

19. A substrate processing apparatus comprising:

a process chamber;

a processing container disposed within the process chamber and having a processing space therein;

a support unit disposed in the processing container and including a support chuck supporting a substrate, a rotating shaft connected to a lower portion of the support chuck, and a support chuck driving unit connected to the rotating shaft and driving the support chuck to rotate about the rotating shaft;

a rear nozzle unit installation unit including a sidewall surrounding the support chuck and the rotating shaft and forming an internal space and a guide wall extending downwardly from an upper end of the sidewall in a radial direction outwardly;

a supply unit including a first rear nozzle unit and a second rear nozzle unit disposed in the rear nozzle unit installation unit; and a liquid inflow preventing unit, wherein each of the first rear nozzle unit and the second rear nozzle unit includes:

a rear nozzle exposed to an upper portion of the guide wall and disposed to be movable in a radial direction of the support unit passing through a center of the support chuck from outside of the sidewall to supply liquid toward a rear surface of the substrate; and a rear nozzle driving unit including a connection rod connected to the rear nozzle through a partial sidewall portion of the sidewall in the internal space and driving the rear nozzle to move;

wherein the rear nozzle of the first rear nozzle unit and the rear nozzle of the second rear nozzle unit are disposed opposite to each other with respect to the rotating shaft on an outer side of the sidewall, and the liquid inflow preventing unit includes an isolation wall connected to the partial sidewall portion of the sidewall, forming an isolation space isolated from the internal space, and penetrated by the connection rod and a sealing member preventing liquid from flowing into the internal space from a gap between the isolation wall and the rear nozzle driving unit.

20. The substrate processing apparatus according to claim 19, wherein the rear nozzle driving unit includes:

a rear nozzle driving motor interlocked with the other end of the connection rod located in the internal space to provide driving force for the rear nozzle to move; and an interlocking rod connecting the other end of the connection rod and an output shaft of the rear nozzle driving motor, wherein the rear nozzle driving motor and the interlocking rod are located outside the support chuck driving unit in the internal space.

* * * * *